United States Patent [19]
Lin

[11] Patent Number: 6,120,953
[45] Date of Patent: Sep. 19, 2000

[54] METHOD OF OPTICAL PROXIMITY CORRECTION

[75] Inventor: Chin-Lung Lin, Kaohsiung, Taiwan

[73] Assignees: United Microelectronics Corp.; United Semiconductor Corp., both of Taiwan

[21] Appl. No.: 09/298,324

[22] Filed: Apr. 23, 1999

[51] Int. Cl.$^7$ ............................................. G03F 9/00
[52] U.S. Cl. ................................. 430/30; 430/296
[58] Field of Search ........................... 430/30, 296

[56] References Cited

U.S. PATENT DOCUMENTS 5,879,844  3/1999  Yamamoto et al. .................... 430/296

*Primary Examiner*—Christopher G. Young
*Attorney, Agent, or Firm*—Martine Penilla & Kim, LLP

[57] ABSTRACT

A method of optical proximity correction. A main pattern is provided. The main pattern has a critical dimension. When the critical dimension is reduced to reach a first reference value or below, a serif/hammerhead is added onto the main pattern. When the critical dimension is further reduced to a second reference value or below, an assist feature is added onto the main pattern. The corrected pattern is then transferred to a layer on wafer with an improved fidelity.

8 Claims, 4 Drawing Sheets

METHOD OF OPTICAL PROXIMITY CORRECTION

BACKGROUND OF THE INVENTION

1 Field of the Invention

The invention relates in general to a method of optical proximity correction (OPC). More particularly, to a method of forming an assist feature, a serif, or a hammerhead on an original pattern, or locally reducing or enlarging the original pattern to reduce optical proximity effect (OPE), so as to optimize the fidelity of the original pattern.

2 Description of the Related Art

In the very advanced fabrication technology of integrated circuits, to reduce the dimensions of devices and to increase the integration are a leading trend and topic for further development. The photolithography and etching step is one of the most crucial factors to determine the reliability and performance of devices and the integrated circuit.

Commensurate with the size reduction, various process limitations have made the photolithography more difficult. The increased integration causes the devices shrinkage and a reduced distance between devices. A deviation is thus easily caused while transferring a pattern from a photo-mask to a layer on a wafer. For example, after being transferred from a photo-mask to a photo-resist layer on a wafer, a right angle corner of the pattern on the photo-mask is often rounded, the line ends would become short, or the line widths increase/decrease, etc. Such effects of deviation are referred to as the optical proximity effect (OPE).

In the integrated circuit of a substantially low integration, these deviations would not greatly affect the performance and operation of devices. However, in the integrated circuit with a high integration, this effect may cause a serious problem. For example, when the line width expands unexpectedly, one metal line may overlap on the other metal line to cause a short circuit, so as to cause a device failure. In other words, the enhancement of operation speed corresponding to the shrinkage of devices is gradually limited due to lack of fidelity for transferred pattern during photolithography processes. An example of optical proximity effect is shown as FIG. 1, in which each corner of a rectangle is rounded, while the linewidth is expanded.

The causes of the optical proximity effect include optical factors (interference between light beams transmitted through adjacent patterns), resist processes (baking temperatures/times, development time, etc), the reflection of light from and irregularity of the substrate. The mainstream of preventing pattern transfer degradation due to the OPE is to add corrections allowing for degradation to a mask in advance. This process is referred to as optical proximity correction (OPC).

Different approaches have been made for the optical proximity correction, for example, in the U.S. Pat. Nos. 5,732,233 and 5,879,844 Grazal et al. and Yamamoto et al., respectively, disclose methods of optical proximity correction. In their disclosures, an assist feature is added onto a main pattern, or the linewidth of the main pattern is increase/decrease to increase the contrast for exposure or to enlarge the process window.

Grazal et al. performs an exposure on a test pattern first. The transferred test pattern is then compared to a main pattern to obtain a deviation between these two patterns to determine whether an optical proximity correction is to be performed. In addition, the correction degree can be determined according to the level of deviation.

Referring to FIG. 2, Yamamoto uses a wafer having a conductive layer (oblique lines) on a diffusion layer (dot area) as an example. In this figure, the parallel edges (the bold lines) of the overlapping part of these two layers are the part to be corrected. In addition, while a distance between two neighboring edge lines are narrower than a threshold value, or if a ratio of the length of an edge line to the distance is less than another threshold value, these edges are to be corrected.

By the above conventional method, an empirical result is required for determining whether an optical proximity correction is to be performed on a pattern. Or alternatively, a relationship between two adjacent layers formed on a wafer has to be obtained. Therefore, it causes a great trouble in data processing.

SUMMARY OF THE INVENTION

Accordingly, the invention provides a method of optical proximity correction. Using the critical dimension (CD) of an original main pattern as a determinant of whether an optical proximity correction is performed on the original main pattern, neither an empirical result nor a relationship between two adjacent layers is required. Therefore, data handling is simplified while fidelity of a transferred pattern is retained.

In the invention, an original pattern to be transferred is provided. The critical dimension of the original pattern is obtained. When the critical dimension is less than or equal to 2.5 times of a wavelength of an exposure light source, serifs are added on each corner of the original pattern, or a hammerhead is added onto each trunk of the pattern. If the critical dimension is less than or equal to the wavelength, an assist feature is added into the original pattern. The original pattern is thus corrected for forwarding an exposure step of a photolithography process. In addition, by correcting the original in a sequence of adding the serifs and hammerhead in front of adding the assist feature, an overlap in the corrected pattern or an overly reduced distance is avoided.

Both the foregoing general description and the following detailed description are exemplary and explanatory only and are not restrictive of the invention, as claimed.

BRIEF DESCRIPTION OF THE DRAWINGS

FIG. 3b shows a corrected pattern of the original pattern as shown in FIG. 3a;

DESCRIPTION OF THE PREFERRED EMBODIMENTS

Typically, the equipment used for a photolithography process includes a reticle, that is, a photo-mask. The reticle has a pattern which reflects a required pattern on a certain layer of an integrated circuit. The reticle can be, for example, a glass plate comprising a transparent portion and a non-transparent portion. The non-transparent portion defines the pattern and is formed by a non-transparent layer, for example, a chromium (Cr) layer. During an exposure step, the reticle is disposed between a light source and the wafer, while a stepper is disposed between the reticle and the wafer. When the light source is incident onto the reticle, the light travels through the transparent portion to project on a photo-resist layer on the wafer under the transparent portion. In contrast, the light source is blocked by the non-transparent portion without shining on the photo-resist layer underlying the non-transparent. The pattern on the photo-mask layer is thus transferred to the photo-resist layer. After development and etching steps, the wafer is patterned.

As mentioned above, as interference or refraction of the light beam through the photo-mask would occur during exposure, on top of other process factors, a distortion occur to the transferred pattern. The invention provides a method for optical proximity correction. By directly measuring the critical dimension of an original pattern, whether optical proximity correction is performed is determined. The optical proximity correction is performed with a sequence of adding a serif or/and a hammerhead before the addition of an assist feature on the original pattern. Thus, deviation between the transferred pattern and the original pattern is minimized.

Figure 1:
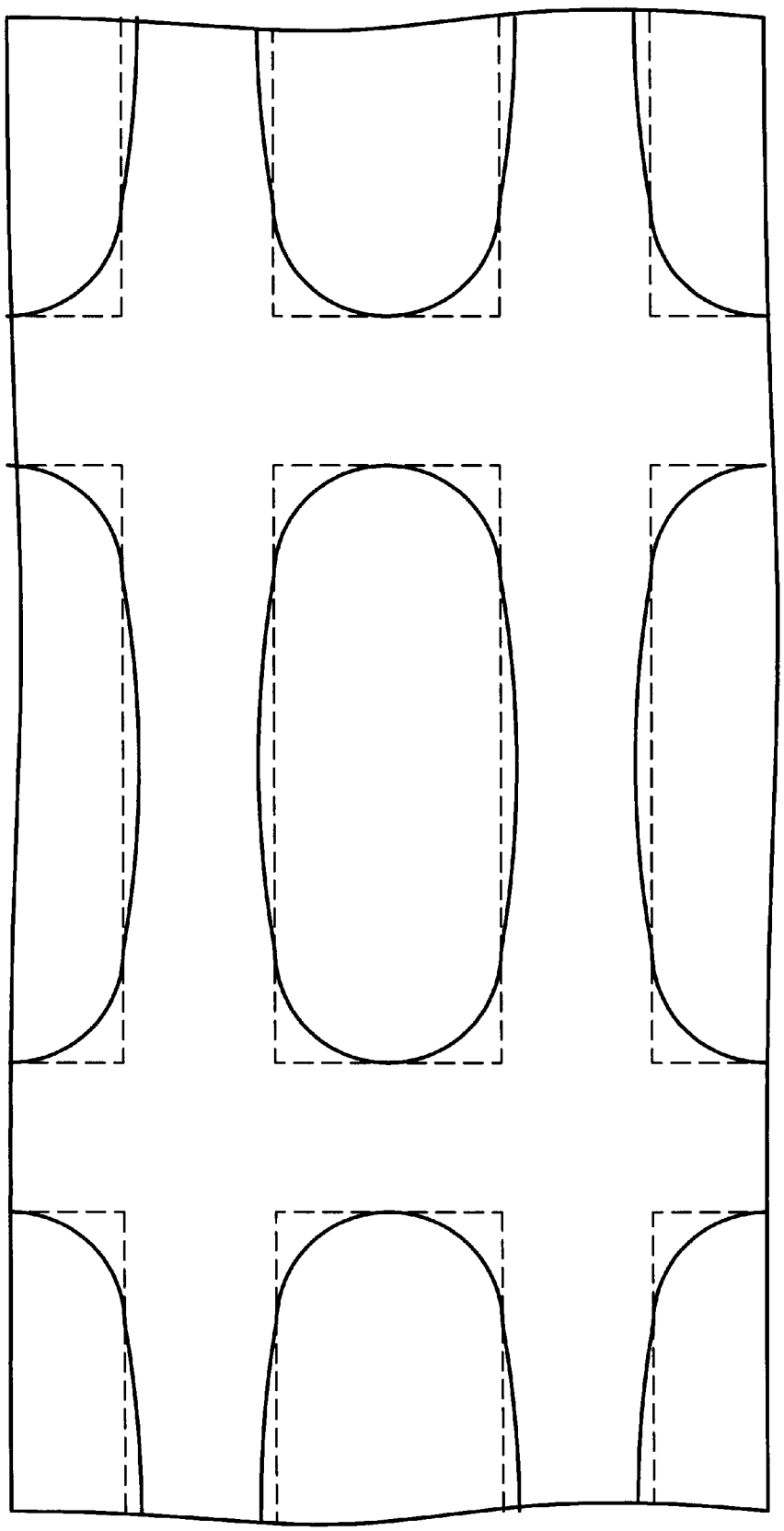
FIG. 1 shows an example of optical proximity effect.
Figure 2:
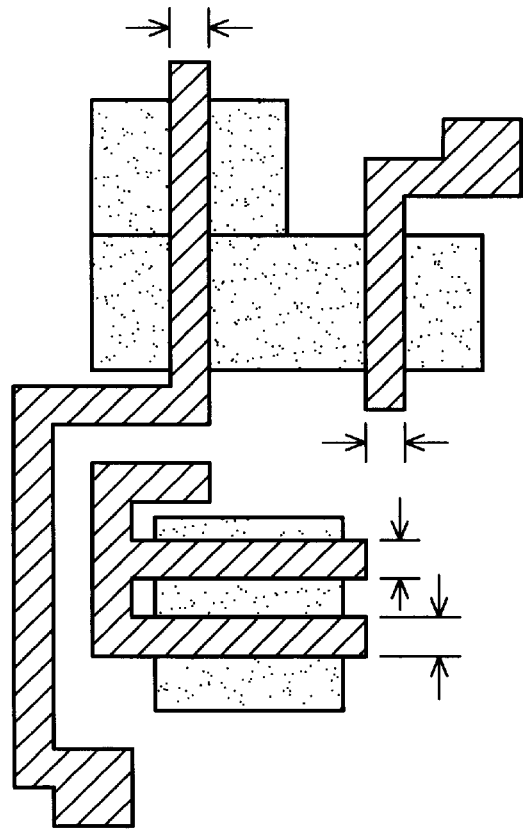
FIG. 2 shows a conventional method to determine the pattern to be corrected.
Figure 3A:
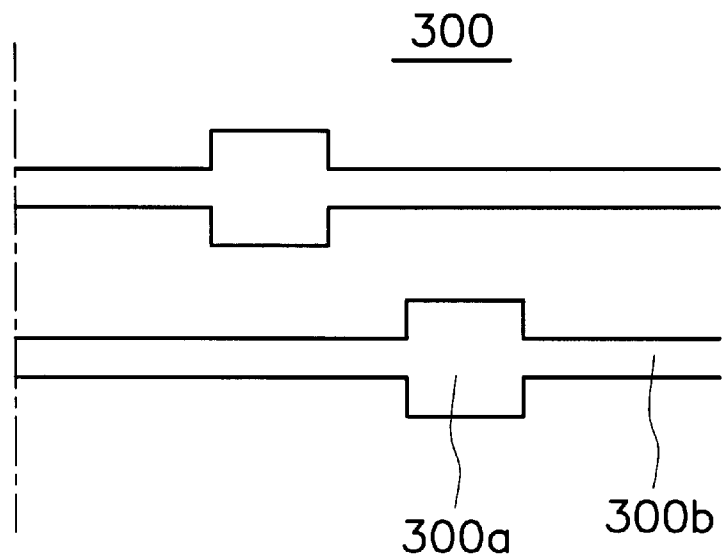
FIG. 3a shows an original pattern to be corrected in a preferred embodiment according to the invention.
Figure 3B:
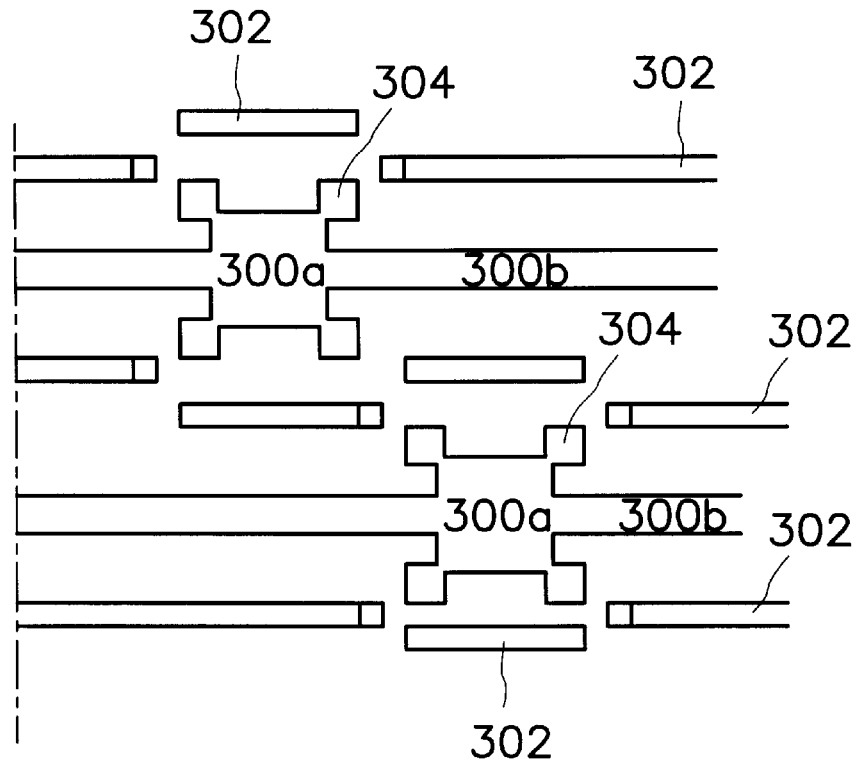

In FIG. 3a, an original main pattern 300 is provided. The main pattern 300 comprises a rectangle pattern 300a and a strip pattern 300b. The critical dimension of the main pattern is obtained. When the critical dimension is less than or equal to a wavelength of a light source used for exposure, an assist feature is added to the main pattern 300. While the critical dimension is less than or equal to 2.5 times of the wavelength, a serif is added on each corner of the main pattern 300, or a hammer head is add on one side of a trunk of the pattern. For example, as shown in FIG. 3b, an assist feature 302 is added to the main pattern 300. When the critical dimension is less than or equal to the wavelength, a serif 304 is added on each of the corners of the rectangle pattern 300a. The addition of the serif or the hammerhead improves fidelity of the pattern, while the addition of the assist feature increases a contrast of the pattern to result in a higher resolution.

However, as shown in FIG. 3B, since the assist feature 302 is added before adding the serifs 304, it can be observed from the figure that a distance between two neighboring patterns is too small. In some occasions, the patterns may even overlap with each other to cause some unwanted connection.

Figure 3C:
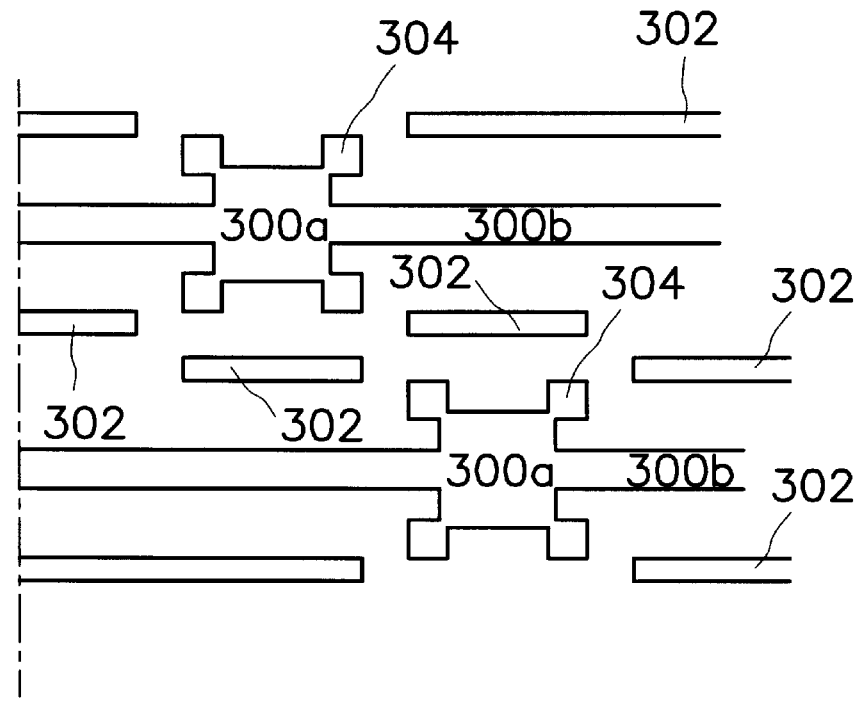
FIG. 3c shows another corrected pattern of the original pattern as shown in FIG. 3a, and FIG. 4 shows a flow chart for performing an optical proximity correction in an embodiment according to the invention.

The drawback in FIG. 3B may be resolved by arranging a sequence for the addition between the serif/hammerhead and the assist feature. That is, adding a serif/hammerhead to the main pattern first. The assist feature is then added according to the pattern corrected with the serif/hammerhead. An adjustment of the assist feature can be made to perform an appropriate correction. In FIG. 3C, a main pattern 300 comprising a rectangle pattern 300a and a strip pattern 300b is provided. The critical dimension of the main pattern 300 is checked determine whether the critical dimension is less than or equal to 2.5 times of a wavelength of a light source for exposure. If so, a serif is added to each corner of the rectangle pattern 300a. After the addition of the serif 304, the assist feature 302 is added. As a result, the problem of overly close patterns or overlap of patterns is thus resolved.

Figure 4:
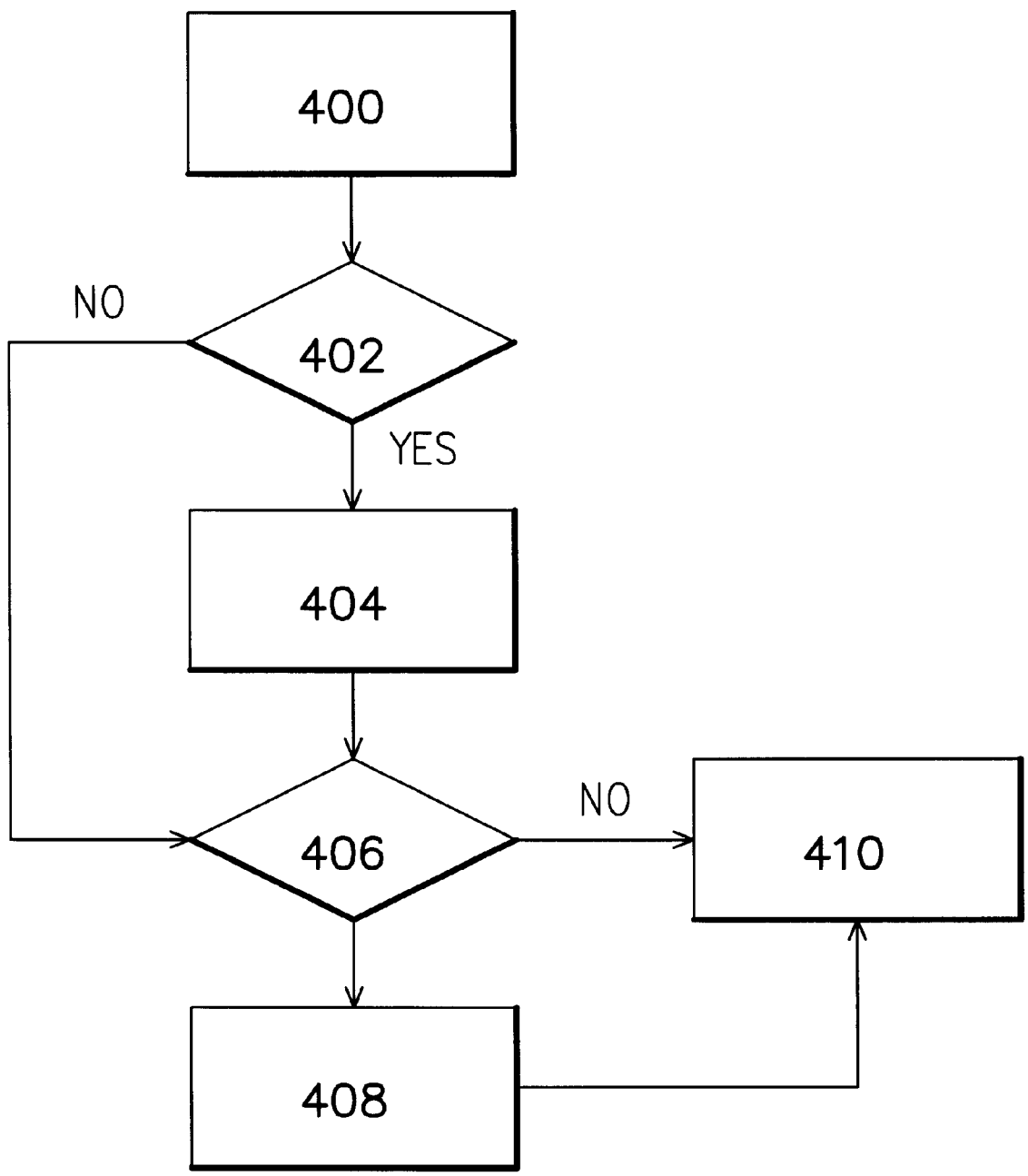

The flow chart of the invention can be referred to FIG. 4. In step 400, a main pattern to be transferred is provided. The critical dimension of the main pattern is checked in step 402. If the critical dimension is no larger than 2.5 times of a wavelength of a light source for exposure, a serif or a hammerhead is added onto the main pattern in step 404. If the critical dimension is larger than 2.5 times of the wavelength, neither a serif nor a hammerhead is added onto the main pattern in step 404. The critical dimension is checked again in step 406. If the critical dimension is no larger than the wavelength, an assist feature is added onto the main pattern 300 in step 408. If the critical dimension is larger than the wavelength, no assist feature is added and step 408 is passed. After the steps described above, a photolithography process is performed in step 410. The rest of the steps for photolithography involve conventional techniques and are not further described herein.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of optical proximity correction, comprising: providing a main pattern;
checking a critical dimension of the main pattern;
adding a serif or a hammerhead on the main pattern when the critical dimension is no larger than 2.5 times of a wavelength of a light source for exposure; and
adding an assist feature on the main pattern when the critical dimension is no larger than the wavelength.

2. The method according to claim 1, wherein the assist feature is added after adding the serif or the hammerhead.

3. The method according to claim 1, comprising further a step of exposure using the light source after adding the assist feature.

4. A method of optical proximity correction, comprising: providing a main pattern;
checking a critical dimension of the main pattern;
adding a first correction pattern to the main pattern when the critical dimension is less than or equal to a first reference value, the first reference value being equal to 2.5 times a wavelength of a light source for exposure;
adding a second correction pattern to the main pattern when the critical dimension is less than or equal to a second reference value, the second reference value being equal to a wavelength of a light source for exposure.

5. The method according to claim 4, wherein the first correction pattern comprises at least a serif on a corner of the main pattern.

6. The method according to claim 4, wherein the first correction pattern comprises at least a hammerhead.

7. The method according to claim 4, wherein the second correction pattern comprises an assist feature.

8. A method of optical proximity correction, comprising: providing a main pattern to be transferred via a photolithography process, wherein the main pattern has a critical dimension and a plurality of right-angled corners;
adding one serif on each of the right-angled corners when the critical dimension is less than or equal to 2.5 times of a wavelength of a light source used for the photolithography process; and
after adding the serifs, adding an assist feature onto the main pattern when the critical dimension is less than or equal to the wavelength.

\* \* \* \* \*